United States Patent
Brokken et al.

(10) Patent No.: US 9,401,248 B2
(45) Date of Patent: Jul. 26, 2016

(54) ACTUATOR DEVICE WITH IMPROVED TACTILE CHARACTERISTICS

(75) Inventors: Dirk Brokken, Eindhoven (NL); Dirk Jan Broer, Eindhoven (NL); Floris Maria Hermansz Crompvoets, Eindhoven (NL); Hendrik De Koning, Eindhoven (NL); Wendy Mireille Martam, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 751 days.

(21) Appl. No.: 13/695,707

(22) PCT Filed: May 3, 2011

(86) PCT No.: PCT/IB2011/051947
§ 371 (c)(1),
(2), (4) Date: Nov. 1, 2012

(87) PCT Pub. No.: WO2011/138735
PCT Pub. Date: Oct. 11, 2011

(65) Prior Publication Data
US 2013/0101804 A1 Apr. 25, 2013

(30) Foreign Application Priority Data
May 4, 2010 (EP) .................................... 10161847

(51) Int. Cl.
*B32B 3/00* (2006.01)
*H01H 3/02* (2006.01)
(Continued)

(52) U.S. Cl.
CPC ............... *H01H 3/02* (2013.01); *G06F 3/016* (2013.01); *G09B 21/003* (2013.01); *H01L 41/04* (2013.01); *H01L 41/0986* (2013.01); *H01L 41/45* (2013.01); *Y10T 428/24612* (2015.01)

(58) Field of Classification Search
CPC ............. G06F 3/016; B32B 3/00; B32B 3/30; H01H 2003/008; H01H 13/84; H01H 3/02; G09B 21/003; Y10T 428/24612
USPC .................. 428/141, 156, 172; 310/331, 345; 345/156
See application file for complete search history.

(56) References Cited

U.S. PATENT DOCUMENTS 7,336,266 B2   2/2008 Hayward et al.
7,385,308 B2   6/2008 Yerdon et al.
(Continued)

FOREIGN PATENT DOCUMENTS

JP   2010026604 A   2/2010
WO  2007099094 A2   9/2007
(Continued)

OTHER PUBLICATIONS

Koo et al: "Development of Soft-Actuator-Based Wearable Tactile Display"; IEEE Transactions on Robotics, vol. 24, No. 3, Jun. 2008, pp. 549-558.
Pailler-Mattei et al: "Contribution of Stratum Corneum in Determining Bio-Tribological Properties of the Human Skin"; Wear, vol. 263, 2007, pp. 1038-1043.
Hendriks et al:"The Relative Contributions of Different Skin Layers to the Mechanical Behavior of Human Skin In Vivo Using Suction Experiments"; Medical Engineering & Physics 28 (2006), pp. 259-266.
(Continued)

*Primary Examiner* — Catherine A Simone (57) ABSTRACT

The invention relates to an actuator device (400) comprising an active layer (410) having directly or indirectly a skin layer (420) on top that can be touched by when in use by a user. The configuration of the active layer (410) can controllably be changed in an extension direction (x, y), and the skin layer (420) comprises a plurality of elevations (E) and intermediate recesses (R). Due to its structure, the skin layer (420) does not hinder conformation changes of the active layer (410) in the extension direction, while it provides favorable tactile characteristics of the actuator device (400). The active layer (410) may particularly comprise an electroactive polymer (EAP). The skin layer (420) may be composed of a plurality of grains isolated from each other, or it may comprise a thin surface layer (421) that is stiffer than the active layer (410).

16 Claims, 4 Drawing Sheets

(51) Int. Cl.
*G06F 3/01* (2006.01)
*G09B 21/00* (2006.01)
*H01L 41/04* (2006.01)
*H01L 41/09* (2006.01)
*H01L 41/45* (2013.01)

(56) References Cited

U.S. PATENT DOCUMENTS

| | | |
|---|---|---|
| 2008/0289952 A1 | 11/2008 | Pelrine et al. |
| 2009/0001855 A1 | 1/2009 | Lipton et al. |
| 2009/0047197 A1 | 2/2009 | Browne et al. |
| 2009/0167704 A1 | 7/2009 | Terlizzi et al. |
| 2010/0007245 A1 | 1/2010 | Jager et al. |
| 2010/0097198 A1 | 4/2010 | Suzuki |

FOREIGN PATENT DOCUMENTS

| | | |
|---|---|---|
| WO | 2008046123 A1 | 4/2008 |
| WO | 2009006318 A1 | 1/2009 |
| WO | 2010000261 A1 | 1/2010 |
| WO | 2011018728 A1 | 2/2011 |

OTHER PUBLICATIONS

Wang et al: "In Vivo Biomechanics of the Fingerpad Skin Under Local Tangetial Traction"; J. of Biomechanics, 40 (4):851-860, 2007.

Prahlad: "Programmable Surface Deformation:Thickness-Mode Dielectric Elastomers and Their Applications"; Chapter 21, "Dielectric Elastomers as Electromechanical Transducers; Fundamentals, Materials, Devices, Models and Applications of an Emerging Electroactive Polymer Technology"; F. Carpi et al., Editors, 2008, Elsevier Publishers, pp. 217-226.

Electroactive Polymer (EAP) Actuators as Artificial Muscles, Reality, Potential, and Challenges, Second Edition, Yoseph Bar-Cohen, Editor, SPIE Press 2004, Chapters 4-7.

Voronoi: "Nouvelles Applications Des Parametres Continus a La Theorie Des Formes Quadratiques"; Journal Fur Die Reine Und Angewandte Mathematic (Crelles Journal), vol. 1908, No. 134, Jan. 1908, pp. 198-287.

Prahlad et al: "Programmable Surface Deformation: Thickness-Mode Electroactive Polymer Actuators and Their Applications"; Smart Structures and Materials 2005: Electroactive Polymer Actuators and Devices(EAPAD), Editted by Yoseph Bar-Cohen, Proceedings of SPIE, vol. 5759, 2005, pp. 121-113.

$$\sigma = \frac{F}{A} = f\left(\frac{\Delta l}{l}\right)$$

FIG. 10

ACTUATOR DEVICE WITH IMPROVED TACTILE CHARACTERISTICS

FIELD OF THE INVENTION

The invention relates to an actuator device having at least one direction of extension and comprising an active layer of which the configuration can controllably be changed. Moreover, it relates to a method for producing an actuator device.

BACKGROUND OF THE INVENTION

US patent application No 2009/0167704 discloses a device for providing haptic feedback to a user of a touch screen. The device comprises a stack with a first layer of transparent electrode lines, a layer of transparent Piezo-electric material, a second layer of transparent electrode lines that extend perpendicularly to those of the first layer, and a touch screen input layer. The Piezo-electric material shrinks and expands in the direction perpendicular to the layers under influence of electric fields applied between the electrodes on opposite sides of the Piezo-electric layer. The device can give feedback to a user by means of a two dimensional array of selectable surface heights, realized by applying a corresponding pattern of voltage differences between the electrode lines. Obviously, the electrodes do not form a skin layer that can be touched by the user during operation. Large voltage differences need to be maintained between the electrode lines of the first layer electrode lines.

The WO 2010/00261 A1 discloses a transducer for converting between mechanical and electrical energies which comprises a planar electroactive polymer (EAP) layer disposed between two electrodes. In order to induce an anisotropic behavior of the EAP, the electrode layers are corrugated with the help of an intermediate plastically deformable material. WO 2007/099094 similarly discloses a transducer for converting between mechanical and electrical energies. A Piezo-electric layer sandwiched between electrodes is used, the electrodes being made of polymer material. As the outermost layers are conductive electrodes, such a transducer device cannot be used on a surface which is directly touched by users.

SUMMARY OF THE INVENTION

Based on this background it was an object of the present invention to provide means by which the surface of an actuator device can get favorable tactile characteristics.

This object is achieved by an actuator device according to claim 1, a use according to claim 10 and a method according to claim 11. Preferred embodiments are disclosed in the dependent claims.

The actuator device according to the present invention may be used for many different purposes and may accordingly have various shapes. The shape should however be such that there is at least one direction of (geometrical) extension. As an example, an actuator device with a single extension direction will have a filamentary shape, while an actuator device with two extension directions will have a planar (not necessarily flat) shape. The actuator device comprises the following components:

a) A first layer that is called "active layer" in the following, wherein the configuration of said active layer can controllably be changed (at least) in the extension direction mentioned above. The active layer may for example shrink or expand in the extension direction upon reception of an appropriate signal (e.g. an electrical field).

b) A second layer that is called "skin layer" in the following and that is disposed above the aforementioned active layer. In this context, the term "above" shall denote an arrangement that is parallel to the active layer (with respect to the extension direction) and directly or indirectly attached to the active layer. Furthermore, the skin layer is structured in such a way that it has a plurality of elevations which are separated by intermediate recesses. As its name indicates, the skin layer is typically the outermost layer of the actuator device, i.e. it can be touched by a user.

Due to its skin layer, the above actuator device can be provided with favorable characteristics. For example, the touch characteristics of the actuator device are determined by the elevations via which a contact to an external object (e.g. the finger of a user) takes place and by the recesses between the elevations, which reduce the available contact area. This provides design parameters that may be used to reduce the friction between the actuator device and an object. Due to its structure, the skin layer further does not or only minimally interfere with the configuration changes of the active layer in the extension direction.

As was already indicated above, the term "actuator device" is used here in a very broad sense, comprising many different applications. The actuator device may for example provide an object with a changeable surface that gives a haptic/tactile feedback to a user, or it can be used to construct a soft, tactile sensor.

The actuator device may optionally comprise at least one passive layer that is disposed between the active layer and the skin layer. As its name indicates, this passive layer cannot change its configuration of its own, but follows configurational changes of the active layer. A typical function of the passive layer is to amplify and/or reshape configurational changes of the active layer.

According to a particular realization of the described actuator device, the skin layer comprises a plurality of (small) bodies that will be called "grains" in the following. The grains consist of another material than the active layer and are isolated from each other by the recesses. The grains may have different regular or irregular three-dimensional shapes, for example the shapes of cylinders with circular or polygonal cross section. Moreover, the grains may be arranged on the surface of the active layer in a regular or irregular pattern (array). As the grains are disconnected, they do not hinder conformation changes of the active layer in the extension direction. The material of the grains preferably has a higher mechanical stiffness than the material of the active layer. In many cases the stiffness can be characterized by the Young's modulus, being as usual defined as the ratio of uniaxial stress over uniaxial strain in the range of stress in which Hooke's Law holds. In order to include materials with a non-linear behavior (e.g. rubbers and many polymers), the "elastic modulus" will in the following be used instead of Young's modulus, wherein this elastic modulus is defined as the local value of Young's modulus in the sense of a linear approximation.

According to another embodiment, the skin layer is composed of at least two sub-layers, wherein the outermost of these sub-layers is called "surface layer" in the following. Said surface layer shall be corrugated, with the material of the surface layer having a higher elastic modulus than the material of the active layer and/or the material of any additional layer between the active layer and the skin layer (e.g. of the passive layer mentioned above). This means that the material of the surface layer is stiffer than that of the layer(s) below, which can be exploited to improve the tactile characteristics of the actuator device. It should be noted that the effective stiffness of the surface layer with respect to movements in the extension direction is largely determined by its corrugated shape and may therefore be much smaller than the stiffness of the material as such. For this reason, the surface layer does not hinder conformation changes of the active layer in the extension direction. The ratio between the elastic modulus of the material of the surface layer and that of the active layer and/or the additional layer preferably ranges between 2:1 and 1000:1.

In a particular embodiment of the aforementioned case, the material of the surface layer has a elastic modulus between about 100 kPa and 50 GPa, preferably between about 1 MPa and 10 GPa, most preferably between about 10 MPa and 10 GPa. It turns out that these values are suited to provide the actuator device with favorable tactile characteristics. The elastic modulus of the material of the active layer may typically range between 10 kPa and 100 MPa, preferably between about 100 kPa and 10 MPa, most preferably between about 500 kPa and 5 MPa.

As already mentioned, the skin layer shall preferentially not hinder the movement of the active layer in the extension direction. To this end, the skin layer should be highly compliant in the extension direction. More specifically, it is preferred that from a force needed to elastically strain (or compress) the whole actuator device in the extension direction, between 0% and 90%, preferably between 0% and 50%, even more preferably between 0% and 25% are needed to strain (or compress) the skin layer while the residual force is needed to strain (compress) the active layer and additional layers (if present). As described above, such a low compliance of the skin layer may be achieved by constituting it of isolated grains (in which case no force is needed to strain the skin layer), or by providing it with corrugations.

The diameter of the elevations of the skin layer typically ranges between 5 μm and 1 mm. The distance between neighboring elevations preferably ranges between 5 μm and 1 mm. Moreover, the depth of the recesses may range between 5 μm and 1 mm. It turns out that these values are suited to provide the actuator device with favorable tactile characteristics.

In general, the active layer may comprise any material in which configuration changes in the extension direction can controllably be induced. Most preferably, the active layer comprises an electroactive material in which such changes can be induced by an electrical field. An especially important example of such materials are electroactive polymers, called "EAP" in the following, preferably of a dielectric electroactive polymer which changes its geometrical shape in an external electrical field. Examples of EAPs may be found in literature (e.g. Bar-Cohen, Y.: "Electroactive polymers as artificial muscles: reality, potential and challenges", SPIE Press, 2004; Koo, I. M., et al.: "Development of Soft-Actuator-Based Wearable Tactile Display", IEEE Transactions on Robotics, 2008, 24(3): p. 549-558; Prahlad, H., et al.: "Programmable surface deformation: thickness-mode electroactive polymer actuators and their applications", in "Dielectric Elastomers as Electromechanical Transducers; Fundamentals, materials, devices, models and applications of an emerging electroactive polymer technology", F. Carpi, et al., Editors. 2008, Elsevier. p. 227-238; US-2008 0289952 A; all the documents are incorporated into the present application by reference).

The invention further relates to a method for producing an actuator device having at least one direction of extension, particularly an actuator device of the kind described above. The method comprises the following steps:

a) Providing an active layer the configuration of which can controllably be changed in the extension direction. As explained above, such an active layer may for example be made of an EAP.

b) Fabricating a skin layer directly or indirectly on top of the aforementioned active layer, wherein said skin layer is structured to have a plurality of elevations which are separated by intermediate recesses.

As expressed in step b) of the method, the skin layer may be indirectly on top the active layer, i.e. with some intermediate layer(s) in between. In line with this, a preferred embodiment of the method comprises the additional step of disposing at least one passive layer between the active layer and the skin layer.

The fabrication of the skin layer in step b) can be achieved in several ways. According to a first embodiment, the fabrication step b) comprises the deposition or generation of grains on the surface of the currently outermost layer (this may be the active layer or, more preferably, a passive layer that covers the active layer). A deposition of grains can be achieved in several different ways, for example by printing. In an alternative procedure, a liquid layer is applied onto the currently outermost layer, and the required grain structure is embossed either with the help of an appropriate mould ("liquid embossing") or by the application of electromagnetic radiation ("photoembossing"). Alternatively, said liquid may wet the outermost layer in a pattern of polar/unpolar regions that have previously been established there. Moreover, grains may first be made by photopolymerization and then be transferred onto the currently outermost layer.

According to other embodiments, step b) of the method comprises the following sub-steps:

b1) Shaping the surface of the currently outermost layer with a plurality of elevations and recesses.

b2) Depositing an additional material on top of the shaped surface, wherein this material has a higher elastic modulus than the material of the active layer.

Instead of the aforementioned sub-step b2), the following alternative sub-step might be used:

b2') Transforming the top layer of the shaped surface such that its elastic modulus becomes higher than that of the active layer's material. Such a transformation may for example be achieved by electromagnetic irradiation.

In both procedures a structured skin layer is produced on the active layer that comprises a plurality of elevations and recesses and that has an outermost surface layer (constituted by the deposited additional material or by the transformed top layer) with a higher intrinsic stiffness than the active layer.

BRIEF DESCRIPTION OF THE DRAWINGS

These and other aspects of the invention will be apparent from and elucidated with reference to the embodiment(s) described hereinafter. These embodiments will be described by way of example with the help of the accompanying drawings in which.

Like reference numbers or numbers differing by integer multiples of 100 refer in the Figures to identical or similar components.

DESCRIPTION OF PREFERRED EMBODIMENTS

Electro-Active-Polymers, abbreviated "EAP", are also known as "polymer actuators" (or "artificial muscles") and have been under development for many years, such that several competing technologies exist (Bar-Cohen, above). Dielectric elastomers are known as materials that change shape under influence of an electric field (electrostriction). They are a class of polymer actuators that are specifically suited for use in relatively thin (potentially conformable) layers (Koo, Jung, above). Moreover, thickness-mode actuation of dielectric polymers has been suggested in the art (Prahlad, Prelin et al., above).

Polymer actuators are ideally suited for tactile display and programmable surface shape applications. They are much simpler and much thinner than conventional electromechanical and piezoelectric actuators, offering a moving surface from an actuation layer of a couple of mms thickness, where conventional means generally require 3-5 cms. As a result, these polymer actuators offer very attractive and potentially very cheap ways to generate tactile feedback user-interfaces, adaptive 'switchable' physical buttons, switching topographical logo's and changeable surface finishings.

A drawback associated with the use of polymer actuators is that the materials are generally quite soft and compliant. With elastic moduli in the order of 1 MPa (or Shore hardnesses of 30) and less, they lack the rigidity and stiffness of materials that are conventionally used on product surfaces (a definition of elastic modulus will be provided in connection with FIG. 10). This gives these materials a distinct 'soft touch' feel, which is often desirable in many applications. However, a product surface made from these low-modulus actuators will also have very high friction with the human skin (often hands or fingertips). This makes handling or touching the surface less attractive, as it becomes very hard to slide the skin over the surface. As a result, the surface will be perceived as 'sticky' by the user. Combined with the low modulus of the surface, this will result in a less-pleasant 'mucus-like' and sticky surface perception.

As a solution, it is proposed here to add a thin, stiffer layer on top of the actuating surface that is structured is such a way that it diminishes friction with the skin (improving the tactile perception of the surface) without adding significant mechanical stiffness to the system that would decrease performance of the actuating surface.

In this context, the inventors have realized that the effective contact area between an actuator device and the human skin (specifically at micro-scale) governs the friction. Human skin is not perfectly flat—it has roughness at different length scales. A compliant material such as a soft elastomer can easily accommodate this roughness, leading to a large contact area, high friction, and a 'sticky' effect caused by the elastomer penetrating the skin roughness folds. Using a less compliant (i.e. more stiff) elastomer to contact the skin can address this problem; however this would, in turn, restrict the movement of the actuator, leading to a significant decrease in actuator performance.

In view of these considerations, it is suggested to use a carefully constructed thin, stiff "skin layer" on top of the inner layer(s) (e.g. on the active layer and/or on a passive layer which covers the active layer's surface), resulting in a surface layer being 'wavy' or 'folded' by comprising a plurality of elevations separated by recesses. That is to reduce the contact area with the touching human skin. This will not restrict the movement of the actuating surface, as it can easily accommodate surface stretching (through bending of a thin continuous layer and/or by widening recesses of a disconnected layer), while offering enough stiffness to avoid excessive friction. This effect is not unlike the top-layer of the human skin (stratum corneum) which is much stiffer that the softer tissues it sits on top of.

In the following, two basic approaches to realize the above general concept will be described:

A. In the first approach, structures are formed on top of a flat electro-responsive system such that the structures are discontinuous, allowing easy deformation of said system.

B. In the second approach, the electro-responsive system itself has a surface topology that allows easy deformation of the harder top layer.

Figure 1:
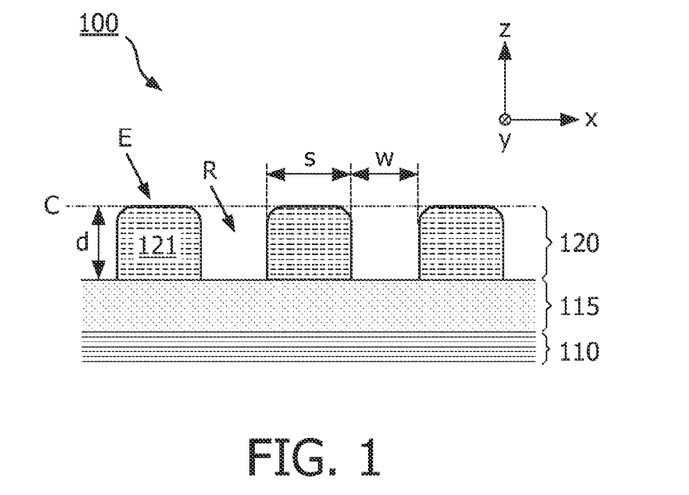
FIG. 1 schematically shows a cross section through a first actuator device according to the present invention having a skin layer that is composed of a plurality of isolated grains.

FIG. 1 schematically shows a cross section through an actuator device 100 that is designed according to the first approach A. The actuator device 100 comprises a layered structure of an "active layer" 110, a "passive layer" 115, and a "skin layer" 120 on top. These three layers geometrically extend in two perpendicular "extension directions", i.e. the directions x and y with respect to the shown coordinate system.

The active layer 110 may shrink or expand in at least one extension direction (and optionally in other directions, too) upon reception of an appropriate signal (e.g. an electrical field). It may for example be composed of an EAP. The passive layer 115 is used to cover the in-plane actuation of the active layer into an out-of-plane motion, suitable for tactile applications. The passive layer 115 may typically comprise some elastomer. The active layer 110 may further consist of several sub-layers (not shown) and/or comprise additional components like electrodes (not shown).

The skin layer 120 is composed of a plurality of disconnected structures, which will be called "grains" 121 in the following and which are schematically indicated by blocks of rectangular cross section. The grains 121 constitute elevations E which are located with their top surfaces in a common contour surface C. The grains 121 are separated by recesses R of depth d (typically between about 5 μm to 1 mm). These recesses R may be void (as shown), or they may be filled with some (soft) solid material (not shown).

The elevations E may have a regular or irregular shape with a medium diameter s between about 5 μm to 1 mm, wherein said diameter is measured at an appropriate height (e.g. at half their height, i.e. at d/2; in case the cross section at this height is non-circular, the diameter may be defined as the largest distance between any two points of said cross section). The medium distance w between neighboring elevations E may also range between about 5 μm to 1 mm.

To make structures according to approach A, various fabrication technologies can be applied such as printing, embossing or lithographically using patterned photopolymerization. Some practical embodiments will be described in the following.

A1. Lithography

On a soft electro-responsive elastomer (i.e. the "active layer 110" or the "passive layer" 115 according to FIG. 1), an array of epoxide structures is made by lithographic exposure of a commercial epoxide base photoresist (e.g. SU8). An example of the resulting array of elevations E (with cylindrical grains 221) is shown in the SEM image of FIG. 2.

The methodology to create the aforementioned structures on top of the soft elastomer depends somewhat on the material of the elastomer and its solvent resistance during the coating and development steps of the SU8. A convenient way of making them is by producing the structures on a separate substrate and subsequently transferring them on the electro-responsive system (elastomer). A particular example comprises the following steps:

A microarray is produced by applying a 15 micrometer thick layer of negative photoresist material (SU8, commercially available from MicroChem Corporation) on a glass substrate that is provided with a 10 micrometer thick polyvinyl alcohol layer (coated from water solution by a doctor blade coating apparatus). A pre-bake step (2 minutes at 65° C. and 10 minutes at 95° C.) ensures that all solvent has evaporated and that the SU8 is in the glassy state—enabling the use of multiple exposure steps. The sample is then exposed through a mask to create the latent image of sub-micrometer sized lamellae (140 mJ/cm$^2$, 351 nm). After the exposures the sample is heated to 65° C. for 1 minute, 95° C. for 2 minutes to induce crosslinking of the photoresist. The non-crosslinked areas are washed away with SU8-developer (mr-Dev 600, MicroChem Corporation), followed by rinsing with propanol-2. The SU8 structure that is made is transferred to the electro-responsive elastomer by pressing the tops of the structure in a thin (0.5 micrometer) layer of a viscous 2-component epoxide and subsequently on the elastomer. The two-component epoxide is allowed to cure and the glass plate is removed by dissolving the polyvinyl alcohol in water.

This procedure gives a structure that has a relatively high modulus of several GPa. Since the structure consists of unconnected stiff elements (grains) on top of the compliant inner layer(s), actuator movement is unconstrained while surface friction will be significant diminished due to the reduction in contact surface.

A2. Liquid embossing

An alternative method to produce structures with a lower modulus though still higher than that of the elastomer is by using liquid embossing. Hereto a liquid layer of a reactive mixture is applied on the rubber (EAP) e.g. by spin coating or by wired-rod coating. In the liquid layer a mould is pressed that has the negative surface topology as the one desired on the actuator. Next the reactive layer is converted into a polymer by curing and the mould is removed. Suitable materials for the grains produced in this way are:

Two-component silicone rubbers that can be cured by moderate heating for low modulus structures.

Acrylate monomer blends that e.g. can be cured by photo-curing for medium modulus structures.

Two-component epoxides that can be cured at room temperature or by moderate heating for high modulus structures.

A3. Photoembossing

Figure 3:
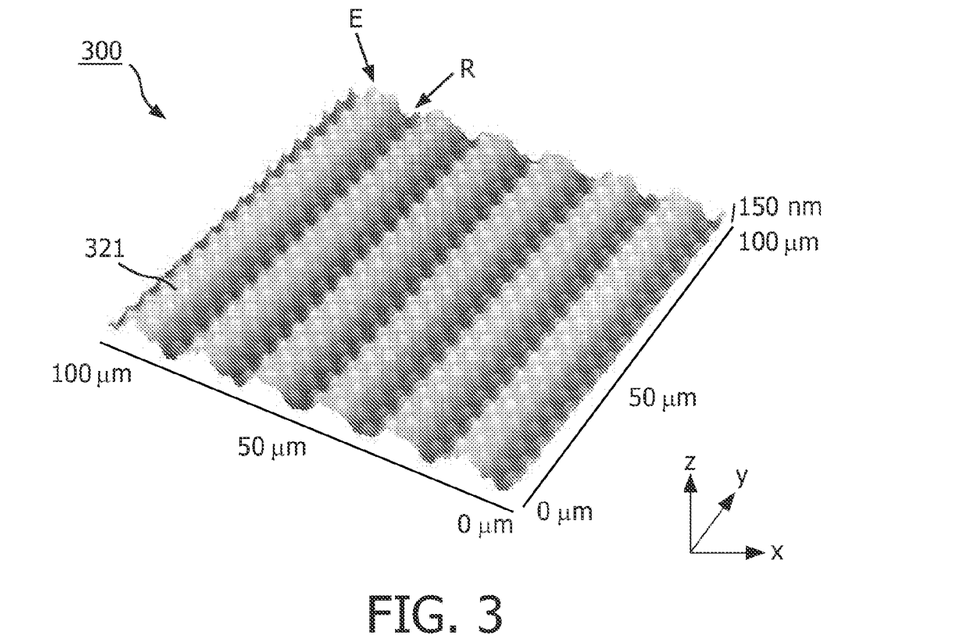
FIG. 3 shows a top view onto a third actuator device having a skin layer composed of an array of wells with superposed elevations.

Yet another alternative method to produce structured surfaces is by so-called photoembossing of a photopolymer. In an example, a mixture of polybenzylmethacrylate (Mw 70 kg/mol; Scientific Polymer Products) was used as a polymeric binder, dipentaerythritol penta/hexa-acrylate (Sigma Aldrich) as a multifunctional monomer, tertiary butyl hydroquinone (Sigma Aldrich) as a retarder, and Irgacure 819 as a photoinitiator (CIBA Specialty Chemicals). As a solvent a 50/50 wt. % mixture of ethoxypropylacetate (Avocado Research Chemicals) and propyleneglycol-methyletheracetate (Aldrich) was used. The photopolymer solution consisted of 23.5 wt. % polymeric binder, 23.5 wt. % monomer, 2.4 wt. % photoinitiator, 3.6 wt. % retarder, and 47 wt. % solvent. The mixture was coated on the elastomer (EAP) and, after evaporation of the solvent, locally exposed to UV light using a mask. A short heating step to 80° C. is sufficient to initiate a diffusion process where the reactive monomer (dipentaerythritol penta/hexa-acrylate) diffuses to the exposed areas while being polymerized, thus creating a surface profile. Multiple exposure before the heat development will give complex surface topologies, well designed for the application at hand. An example of an actuator device 300 with a surface of elevations E and recesses R obtained after subsequent exposure through a line mask and a hole mask is shown in FIG. 3.

A4. Printing

In yet another manufacturing method the structures are brought on the electro-responsive elastomer (EAP) by printing. Several printing methods are available such as inkjet printing and offset printing. Eventually the printing ink consist of acrylate monomers and is solvent free to make the process compatible with the often less solvent-resistant elastomer. In that case the printing can be followed by a UV curing step.

A5. Wetting/dewetting

A further method to form a grained skin layer is by making use of wetting/dewetting of a top layer coated on the EAP layer. The EAP layer is made locally polar by a UV ozone treatment using a shadow mask that locally shields the EAP layer. By this a pattern of small polar islands is formed on an a polar surface. When a UV curing formulation is brought on top of the film it tends to dewet such that small droplets are being formed on the polar islands. By a short UV exposure these droplets are converted into a solid material, i.e. the desired grains.

In the following, the second approach B will be explained in more detail. In approach B, the elastomer layers have a surface topology that allows easy deformation of the harder top layer.

Figure 4:
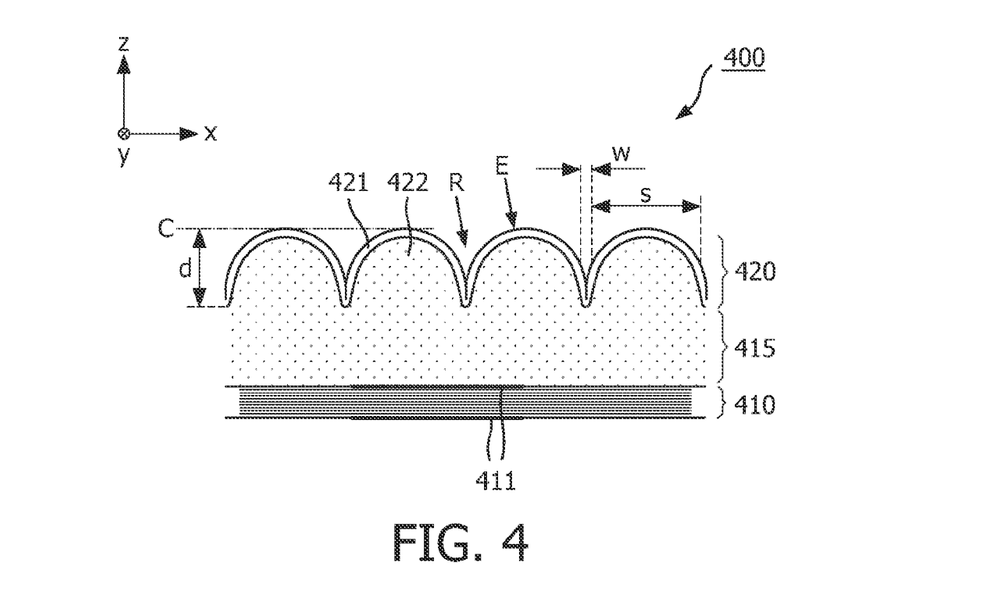
FIG. 4 schematically shows a cross section through a fourth actuator device according to the present invention having a skin layer with corrugations of semicircular cross section.

FIG. 4 shows in this respect schematically a cross section through an actuator device 400 that is designed according to the second approach B. The actuator device 200 comprises an active layer 410, e.g. an EAP. On top of said active layer is a passive layer 415, and on top of this a skin layer 420. The skin layer 420 is composed of elevations E of diameter (half-width) s with approximately semicircular cross section, which are separated by recesses R of depth d and width w. The elevations E are mainly composed of a kernel 422 of the same material as the passive layer (i.e. this material extends continuously between the passive layer 415 and the skin layer 420). On top of the kernel 422 is a surface layer 421 of a material with a higher elastic modulus. 411 and 511 represent an electrode layer that is compliant with the device in the sense that it can deform and stretch with the active layer 410 and respective 510.

The stretchable electrode structure can be made of a composition containing typically at least one material chosen from the following list:
- carbon black,
- carbon nanotubes,
- graphene,
- poly-aniline (PANI), and
- poly(3,4-ethylenedioxythiophene) (PEDOT), e.g., poly(3,4-ethylenedioxythiophene) poly(styrenesulfonate) (PEDOT:PSS).

Figure 5:
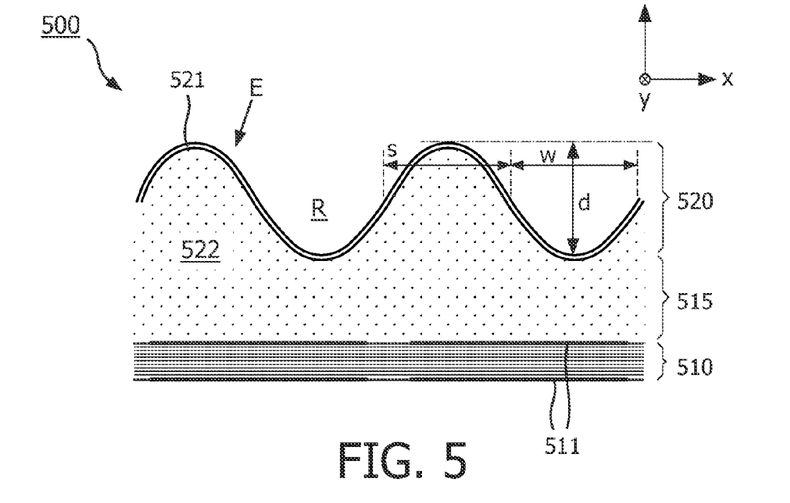
FIG. 5 schematically shows a cross section through a fifth actuator device having a skin layer with sinusoidal corrugations.
Figure 6:
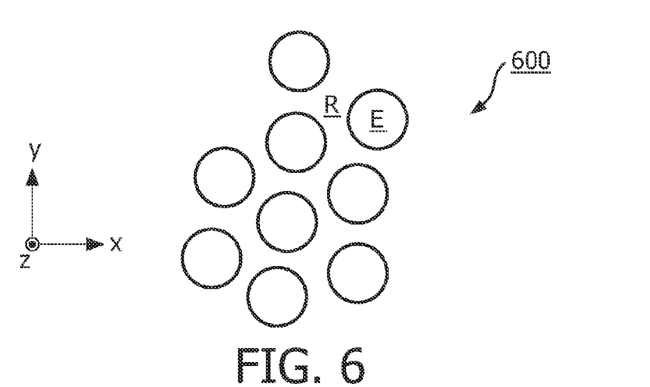
FIG. 6 shows a tow view onto a sixth actuator device having elevations of circular cross-section.
Figure 7:
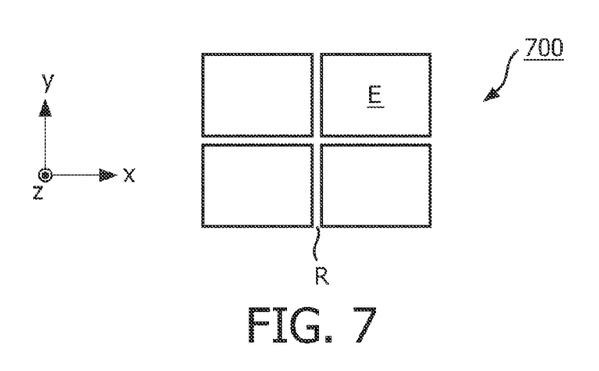
FIG. 7 shows a tow view onto a seventh actuator device having elevations of rectangular cross-section.
Figure 8:
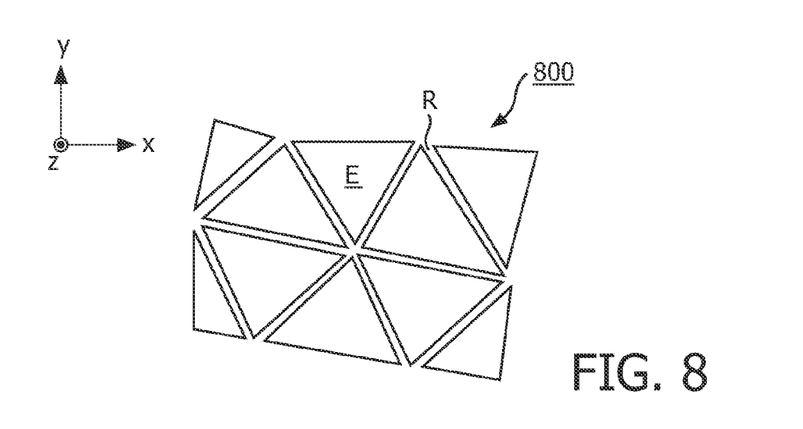
FIG. 8 shows a tow view onto an eights actuator device having elevations of triangular cross-section.
Figure 9:
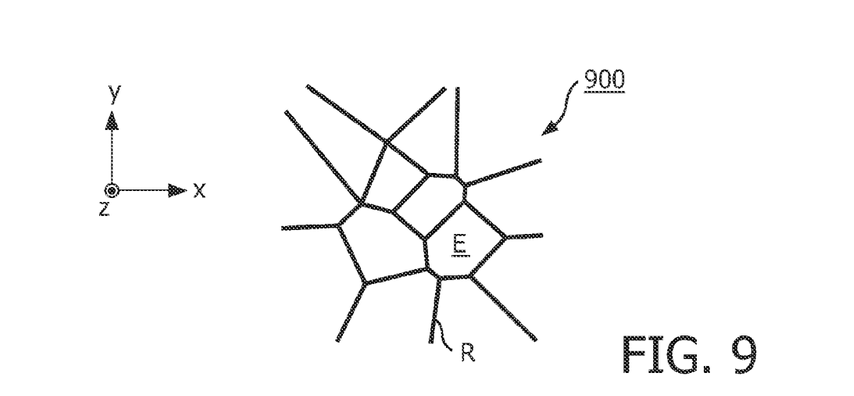
FIG. 9 shows a tow view onto a ninth actuator device having elevations separated in a Voronoi tessellation.

For instance, a stretchable electrode structure made of a composition that includes carbon black enables very well the electrode layer 411 and 511 to stretch with the active layer 410 and 510.

FIG. 5 shows an actuator device 500 similar to that of FIG. 4. The only difference is that the cross section through the skin layer 520 resembles a sinusoidal function.

To make structures according to approach B, e.g. the structures of FIG. 4 or 5, an appropriate methodology is by using moulding of the EAP elastomer and/or the passive layer by shaping its surface against a mould. Two practical embodiments will be described in the following.

B1. Coating

In a first example the EAP elastomer and/or the passive layer on top of the EAP could for instance consist of a two-component silicone rubber which adapts to a mould surface during curing, yielding the corrugated surface structures shown for example in FIG. 4 or 5. This corrugated surface can then subsequently be coated with a harder surface layer. Appropriate materials for this surface layer comprise for example a UV curing acrylate coating having the following composition:
- 90 wt-% tripropyleneglycoldiacrylate
- 4 wt-% 2-ethylhexyl acrylate
- 2 wt-% hexanediol diacrylate
- 1 wt-% octadecyl thiol
- 3 wt-% Irgacure 819 (CIBA Specialty Chemicals).

Prior to coating the EAP elastomer and/or the passive layer on top of it is given a UV ozone treatment to enhance adhesion and wetting. The acrylate coating spin coated on the EAP or the passive layer such that a thickness of 1 micrometer is formed and is UV exposed under a nitrogen blanket.

In another example the surface coating consist of a solution of 5 wt-% polyethylmethacrylate in a solvent mixture of tetrahydrofuran/ethanol (1/1 w/w). This mixture is applied on the EAP or the passive layer by spin coating and leaves a 0.2 micrometer thin film. To prevent swelling of the EAP or the passive layer in the solvent the contact time between dosing the solution droplets and spinning is kept as short as possible, typically <5 seconds.

In another example, the coating could be made from a thin (100 nm-5 microns) elastic foil that is glued to or attached on the surface in a corrugated way. This corrugation can be realized by applying the film to a pre-stretched substrate, and subsequently releasing the pre-stretch, forcing the film to buckle in a corrugation shape.

B2. UV initiated polymerization

Another convenient method comprises the construction of the elastomer EAP layer from a gel based on a block copolymer and an inert liquid material. The block-copolymer consists of a miscible and a non-miscible segment with the inert liquid thus providing some mechanical integrity while the modulus remains very low. In order to provide a harder top layer to this mixture, some monomer is added in a low concentration, e.g. 1 wt. % trimethylol propane triacrylate, together with a photoinitiator and a dye that absorbs in the same wavelength region as the photoinitiator. The procedure is now as follows. The polymer gel is giving its surface topology by pressing it against a UV transparent mould. The mixture is exposed through the mould with UV light. The penetration depth of the light in the mixture is very low because of the presence of the dye and polymerization can take place only near the interface between gel and mould. During the polymerization monomer diffuses to the interface thus forming a thin, but hard top layer that keeps the gel in its shape after removal of the mould.

In the following, some general considerations regarding the active layer 110-510, the (optional) passive layer 115, 415, 515, and the skin layer 120-520 of an actuator device according to the invention are explained in more detail. As already mentioned above, the skin layer should accomplish two things:

1. The skin layer should diminish the unwanted large friction effect. To this end, the skin layer should have (one or more) of the following properties, which are aimed at reducing the contact area with the skin:

1.a Most preferably, the skin layer of the actuator device should have an elastic modulus (stiffness) that is at least one tenth of the equivalent elastic modulus (either in shear or extension) of the top layer of human skin. More preferably, the skin layer of the actuator device should be stiffer than the top layer of the human skin. Even more preferably, its stiffness should be significantly larger (10-100 times) than the tensile stiffness of the human skin. These properties will ensure that the top-layer of the actuator cannot 'follow' the roughness topography present in the human skin, which would increase the friction as it allows a large effective contact area.

The stiffness (elastic modulus) of the top layer of the human skin varies significantly with Relative Humidity (RH) of the skin. Moreover, the human skin is a layered structure with mechanical properties that vary significantly between the different layers. The top layer of the human skin (stratum corneum) can be as stiff as 1 GPa in its upper (dry) layers (Hendriks, F. M., D. Brokken, et al., "The relative contributions of different skin layers to the mechanical behavior of human skin in vivo using suction experiments", Medical Engineering and Physics 28(3): 259-266; Pailler-Mattei, C., S. Pavan, et al., "Contribution of stratum corneum in determining bio-tribological properties of the human skin", Wear 263(7-12): 1038-1043). The stiffness of 'whole' fingertip skin is generally much lower, 1-5 MPa (Wang, Q. and V. Hayward, "In vivo biomechanics of the fingerpad skin under local tangential traction", Journal of biomechanics 40(4): 851-860). For the purposes of the present invention, an equivalent elastic skin stiffness or modulus of 1 GPa can be assumed for surfaces without roughness and surfaces with feature-sizes of 1 micron or less, linearly decreasing to a stiffness of 5 MPa for feature sizes of 1 mm (and more).

1.b In combination with the previous stiffness, the surface shape (or topography) should be defined in such a way that the contact area is minimized. As the human skin itself is also a rough surface, the most successful strategy to accomplish this is to provide the skin layer of the actuator device with a significant roughness, preferably at scales below the scale of the human skin roughness. Human skin roughness is typically in the order of 40 micron (face) to least 100 microns or more (fingertips), with wavelengths of 100 microns to 1 mm (wherein the "roughness" corresponds to the depth d and the "wavelength" to the distance w+s in the artificial structures of FIGS. 4, 5). For haptic surfaces that can be touched, the fingertips are specifically relevant. As a result, the roughness (depth d) of surface structures in an actuator device should preferably be smaller than 100 microns, more preferable smaller than 30 microns (the size of a single skin-surface cell), with wavelengths in the same order of magnitude as the roughness.

2. The skin layer of the actuator device should have mechanical properties and dimensions that ensure that the skin layer does not hinder the deformation of the soft actuator structures on which it is placed, i.e. of the active layer and/or the passive layer (if present).

2.a To achieve the aforementioned goal, the skin layer of an actuator device according to FIG. 4 or 5 should have a tensile stiffness (defined as the product of the elastic modulus of the layer and its thickness d) smaller that the tensile stiffness of the whole actuator device. More preferably, its tensile stiffness should be smaller than half of the tensile stiffness of the whole actuator device, most preferably significantly smaller (at least 10 times) than the tensile stiffness of the whole actuator device. Ideally, the tensile stiffness of the skin layer does not exceed 1% of the tensile stiffness of the whole actuator device. In other words, this means that from a force applied to elastically strain the whole actuator device, only 1% is needed to strain the skin layer while the residual force is needed to strain the active layer and the passive layer (if present). It should be noted that a corrugated film has a much lower tensile stiffness than the same film that is straight.

Figure 2:
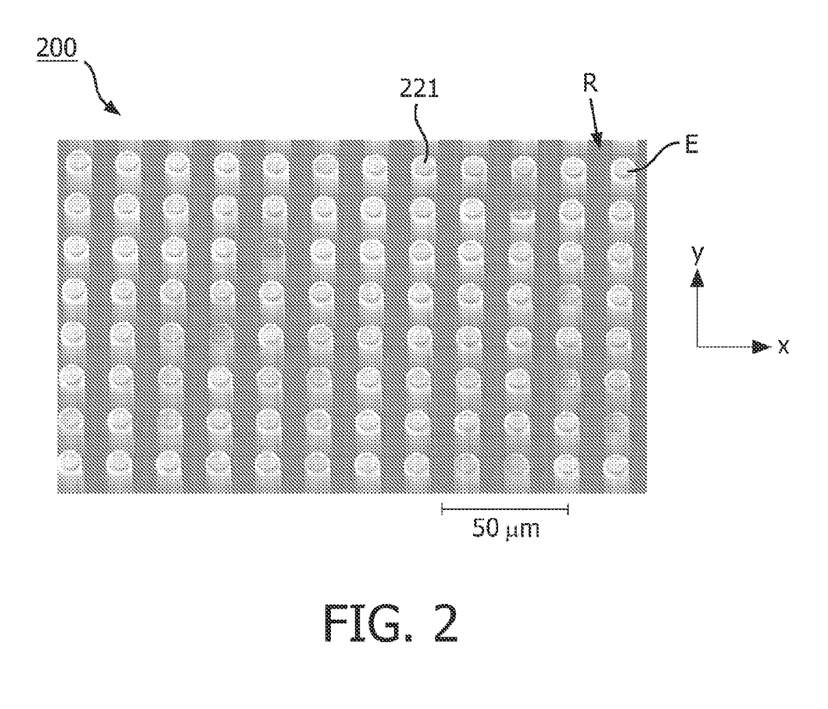
FIG. 2 shows a top view onto a second actuator device having a skin layer composed of an array of epoxide cylinders.

2.b Alternatively, the skin layer can be structured as in FIGS. 1 to 3, i.e. be composed of disconnected grains. In this case the grains will exert no counter-force at all against a strain of the actuator device.

Combining requirements 1 and 2.a sketched above typically leads to a relatively thin, non-homogeneous or corrugated layer on top of the active or passive layer of an actuator device. As an example, a 2 mm thick actuator device with an elastic modulus of about 1 MPa may be considered. This means the whole actuator tensile stiffness is 1 MPa·2 mm=1 N/mm²·2 mm=2 N/mm. An ideal surface layer with a modulus of 2.5 GPa would then need to be significantly thinner than 2 N/mm/2.5 GPa=0.8 µm. In experiments, 1.5 µm thick surface layers with a modulus of 4 GPa showed good performance. It should be noted that for the case of a corrugated film, this layer could be significantly thicker while still achieving the right tensile stiffness.

FIGS. 6 to 9 show top views of actuator devices 600 to 900 with different possible shapes of the elevations E and recesses R. These variants include circular (FIG. 6), rectangular (FIG. 7), triangular (FIG. 8), and Voronoi (FIG. 9; cf. G. Voronoi, "Nouvelles Applications des Paramètres Continus à la Théorie des Formes Quadratiques. Deuxième Mémoire: Recherches sur les Parallélloèdres Primitifs", Journal für die reine und angewandte Mathematik, Vol. 134, p. 198-287, 1908) structures of the elevations E.

The described actuator devices can be used in following fields/products:

Haptic (adaptive) User Interfaces.
Adaptive product finishings (changing surface shapes).
Soft polymer sensor surfaces.
Braille displays.
Hybrid (optical/mechanical) displays.
Soft tactile (pressure) sensors.

In the embodiment of a sensor, one or more additional electrode layers above the EAP may potentially be added for tactile sensing.

Figure 10:
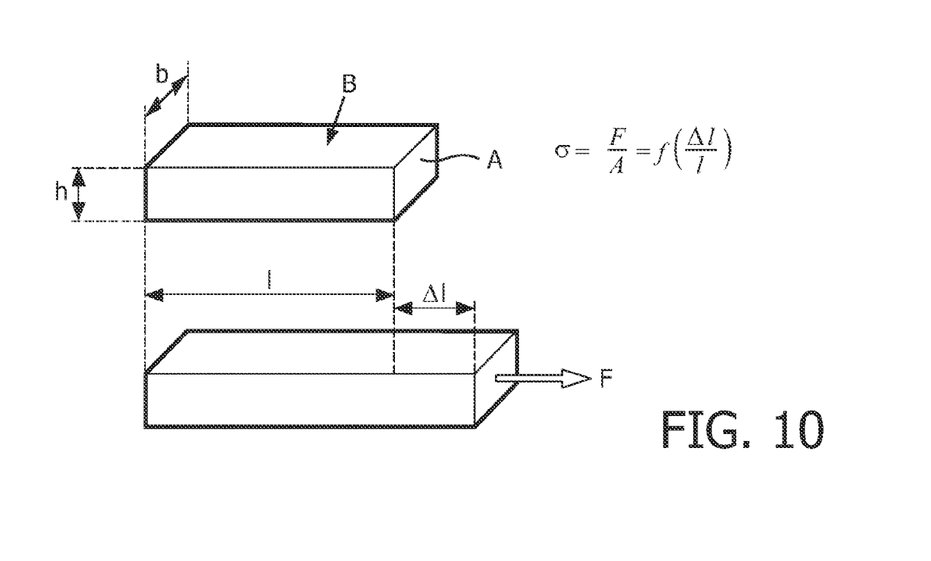
FIG. 10 illustrates the definition of elastic modulus.

FIG. 10 schematically illustrates the definition of elastic modulus E for a cuboid body B of (stress-free) length l, thickness h, and width b, having a cross sectional area A=b·h. When a force F is applied perpendicularly to the face A of this body B (while the other end is fixed), the body will deform by an amount $\Delta l$. For an elastic body, there will be a unique relation f between the applied stress $\sigma = F/A$ and the resulting strain $\in = \Delta l/l$, i.e.

$$\sigma = f(\in).$$

The "elastic modulus" is then defined as the derivative $E = df/d\in$ of this relation. In the general, non-linear case, this elastic modulus depends on the strain E. In the linear case, i.e. when Hook's Law is valid, the elastic modulus is a constant (called "Young's modulus") according to the simplified formula $(F/A) = E \cdot (\Delta l/l)$.

Typically, the body B will be made of a homogeneous material, and the elastic modulus will represent an intrinsic characteristic constant of said material. The body B might however also be some structured object, for example a part of the skin layers 420 or 520 shown in FIGS. 4 and 5, respectively. In this case, the relation between the applied stress (F/A) and the resulting strain ($\Delta l/l$) will depend on the geometrical structure, too. For these cases, we refer to the elastic modulus as the "equivalent" elastic modulus of a certain volume of material.

If the thickness h is considered as a free design parameter, it is convenient to consider the "tensile stiffness" of the body B, which is the product of elastic modulus and thickness, e.g. the value E·h.

Finally it is pointed out that in the present application the term "comprising" does not exclude other elements or steps, that "a" or "an" does not exclude a plurality, and that a single processor or other unit may fulfill the functions of several means. The invention resides in each and every novel characteristic feature and each and every combination of characteristic features. Moreover, reference signs in the claims shall not be construed as limiting their scope.

The invention claimed is:

1. An actuator device having at least one direction of extension (x, y), comprising:
   a) an active layer of which a configuration in the direction of extension can controllably be changed; and
   b) a further layer disposed above said active layer and structured to have a plurality of elevations (E) separated by intermediate recesses (R),
      wherein said further layer is a skin layer that, in use, includes an outermost surface layer of the actuation device that can be touched by a user, and
      wherein the skin layer comprises one selected from the group consisting of (a) structures formed on top of a layered electro-responsive system that comprises at least (i) the active layer or (ii) the active layer and a passive layer on the active layer, wherein the structures allow deformation of the layered electro-responsive system, and (b) a surface topology of the layered electro-responsive system that allows deformation of the outermost surface layer,
      wherein the skin layer and the active layer are mechanically interconnected over a surface of overlap of a projection of the skin layer on the active layer in a direction substantially perpendicular to the active layer, and
      wherein a material of the skin layer has an elastic modulus that comprises one selected from the group consisting of (i) between about 100 kPa and 50 GPa, (ii) between about 1 MPa and 10 GPa, and (iii) between about 10 MPa and 10 GPa.

2. The actuator device according to claim 1, wherein a stiffness of a material of the skin layer per se is greater than a further stiffness of the active layer.

3. The actuator device according to claim 1, characterized in that wherein the active layer comprises electrodes.

4. The actuator device according to claim 1, wherein the skin layer further comprises a plurality of grains that are isolated from each other by the recesses.

5. The actuator device according to claim 1, further comprising the passive layer on the active layer, disposed between the active layer and the skin layer.

6. The actuator device according to claim 1, wherein the skin layer further comprises a plurality of grains that are isolated from each other by the recesses (R) and that consist of another material than the active layer.

7. The actuator device according to claim 1, wherein the skin layer further comprises a surface layer that is corrugated, a material of said surface layer having a higher elastic modulus than another material of the active layer and/or a further material of any additional layer between the active layer and the skin layer.

8. The actuator device according to claim 1, wherein the active layer comprises one selected from the group consisting of (i) an electroactive material and (ii) an electroactive polymer.

9. Use of an actuator device according to claim 1, comprising changing the configuration of the active layer in the direction of extension of the actuator device under control of a signal while the user touches the outermost surface layer of the actuator device, wherein the outermost surface layer touched by the user is the skin layer disposed above said active layer and structured to have the plurality of elevations (E) separated by intermediate recesses (R).

10. An actuator device having at least one direction of extension (x,y), comprising:
   a) an active layer of which a configuration in the direction of extension can controllably be changed; and
   b) a further layer disposed above said active layer and that is structured to have a plurality of elevations (E) separated by intermediate recesses (R),
      wherein said further layer is a skin layer that, in use, is an outermost layer of the actuation device that can be touched by a user,
      wherein the skin layer and the active layer are mechanically interconnected over a surface of overlap of a projection of the skin layer on the active layer in a direction substantially perpendicular to the active layer,
      wherein the skin layer comprises a plurality of grains that are isolated from each other by the recesses, and
      wherein a material of the skin layer has an elastic modulus that comprises one selected from the group consisting of (i) between about 100 kPa and 50 GPa, (ii) between about 1 MPa and 10 GPa, and (iii) between about 10 MPa and 10 GPa.

11. A method for producing an actuator device having at least one direction of extension (x, y), said method comprising the steps of:
   a) providing an active layer of which the configuration in the direction of extension can controllably be changed; and
   b) providing a further layer disposed above said active layer and structured to have a plurality of elevations (E) separated by intermediate recesses (R),
      wherein said further layer is a skin layer that, in use, includes an outermost surface layer of the actuation device that can be touched by a user,
      wherein the skin layer comprises one selected from the group consisting of (a) structures formed on top of a layered electro-responsive system that comprises at least (i) the active layer or (ii) the active layer and a passive layer on the active layer, wherein the structures allow deformation of the layered electro-responsive system, and (b) a surface topology of the layered electro-responsive system that allows deformation of the outermost surface layer,
      wherein the skin layer and the active layer are mechanically interconnected over a surface of overlap of a projection of the skin layer on the active layer in a direction substantially perpendicular to the active layer, and
      wherein a material of the skin layer has an elastic modulus that comprises one selected from the group consisting of (i) between about 100 kPa and 50 GPa, (ii) between about 1 MPa and 10 GPa, and (iii) between about 10 MPa and 10 GPa.

12. The method according to claim 11, further comprising an additional step of providing the passive layer on the active layer, disposed between the active layer and the skin layer.

13. The method according to claim 11, wherein providing the further layer includes providing the skin layer that further comprises a plurality of grains that are isolated from each other by the recesses (R).

14. The method according to claim 11, wherein providing the further layer includes providing the skin layer that further comprises:
   b1) providing a plurality of grains that are isolated from each other by the recesses (R), and
   b2) providing the plurality of grains that consist of another material than the active layer.

15. The method according to claim 11, wherein providing the further layer includes providing the skin layer that further comprises:
   b1) providing a surface layer that is corrugated, and
   b2') providing a material of the surface layer having a higher elastic modulus than another material of the active layer and/or a further material of any additional layer between the active layer and the skin layer.

16. For use in an actuator device having at least one direction of extension (x, y), a combination comprising:
   an active layer of an electroactive material, wherein a configuration of the active layer can controllably be changed in the extension direction; and
   a further layer disposed above said active layer and structured to have a plurality of elevations (E) separated by intermediate recesses (R),
   wherein:
      said further layer is a skin layer that, in use, is an outermost surface layer of the actuation device that can be touched by a user,
      the skin layer and the active layer are mechanically interconnected over a surface of overlap of a projection of the skin layer on the active layer in a direction substantially perpendicular to the active layer, and
      wherein a material of the skin layer has an elastic modulus that comprises one selected from the group consisting of (i) between about 100 kPa and 50 GPa, (ii) between about 1 MPa and 10 GPa, and (iii) between about 10 MPa and 10 GPa.

* * * * *